United States Patent
Nie et al.

(10) Patent No.: US 12,118,288 B2
(45) Date of Patent: Oct. 15, 2024

(54) METHOD FOR CONFIGURING SUB ROUTE FLOW, STORAGE MEDIUM, AND EQUIPMENT

(71) Applicant: CHANGXIN MEMORY TECHNOLOGIES, INC., Hefei (CN)

(72) Inventors: Ai Nie, Hefei (CN); Ying Xu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 434 days.

(21) Appl. No.: 17/502,867

(22) Filed: Oct. 15, 2021

(65) Prior Publication Data

US 2023/0027408 A1 Jan. 26, 2023

Related U.S. Application Data

(63) Continuation of application No. PCT/CN2021/108916, filed on Jul. 28, 2021.

(30) Foreign Application Priority Data

Jul. 19, 2021 (CN) .......................... 202110813372.6

(51) Int. Cl.
*G06F 30/398* (2020.01)
*G06F 30/394* (2020.01)

(52) U.S. Cl.
CPC .......... *G06F 30/398* (2020.01); *G06F 30/394* (2020.01)

(58) Field of Classification Search
None
See application file for complete search history.

(56) References Cited

U.S. PATENT DOCUMENTS

2013/0191689 A1* 7/2013 Almog ............... G06F 11/2236
                                                                714/E11.178
2016/0063744 A1    3/2016 Freeman

FOREIGN PATENT DOCUMENTS

| CN | 101833507 A | 9/2010 |
| CN | 108170118 A | 6/2018 |
| CN | 109408370 A | 3/2019 |
| CN | 111459796 A | 7/2020 |
| CN | 112445695 A | 3/2021 |

OTHER PUBLICATIONS

International Search Report in Application No. PCT/CN2021/108916, mailed on Apr. 19, 2022.

* cited by examiner

*Primary Examiner* — Giovanni Astacio-Oquendo
*Assistant Examiner* — Carl F. R. Tchatchouang
(74) *Attorney, Agent, or Firm* — Syncoda LLC; Feng Ma (57) ABSTRACT

A sub route flow is a route flow different from a main route flow in testing of a semiconductor product. A method for configuring a sub route flow includes: determining at least one test item of the semiconductor product; obtaining a first test template corresponding to the test item, wherein the first test template includes preset test parameters; displaying the preset test parameters; receiving test parameters adjusted according to the preset test parameters; configuring current test parameters of the test item according to the adjusted test parameters; and forming the sub route flow of the semiconductor product according to the current test parameters of the test item.

14 Claims, 11 Drawing Sheets

METHOD FOR CONFIGURING SUB ROUTE FLOW, STORAGE MEDIUM, AND EQUIPMENT

CROSS-REFERENCE TO RELATED APPLICATIONS

This application is a continuation of International Application No. PCT/CN2021/108916 filed on Jul. 28, 2021, which claims priority to Chinese Patent Application No. 202110813372.6 filed on Jul. 19, 2021. The disclosures of these applications are hereby incorporated by reference in their entirety.

BACKGROUND

After a wafer is manufactured, the testing of the wafer is a crucial route flow. In order to analyze product characteristics and reliability and improve product yield, the user will do a series of engineering experiments for verification, and the engineering experiment route flow often involves adding, modifying, and deleting operations.

SUMMARY

The present disclosure relates to, but is not limited to, a method and an apparatus for configuring a sub route flow, a storage medium, and an equipment.

The subject matter is described in detail herein below, which is not intended to limit the scope of protection of claims.

The present disclosure provides a method and an apparatus for configuring a sub route flow, a storage medium, and an equipment.

According to the first aspect of the embodiments of the present disclosure, a method for configuring a sub route flow is provided, the sub route flow is a route flow different from a main route flow in testing of a semiconductor product, and the method for configuring a sub route flow includes:
  determining at least one test item of the semiconductor product;
  obtaining a first test template corresponding to the test item, wherein the first test template includes preset test parameters;
  displaying the preset test parameters;
  receiving test parameters adjusted according to the preset test parameters;
  configuring current test parameters of the test item according to the adjusted test parameters; and
  forming the sub route flow of the semiconductor product according to the current test parameters of the test item.

The second aspect of the present disclosure provides an apparatus for configuring a sub route flow, the sub route flow is a route flow different from a main route flow in testing of a semiconductor product, and the apparatus for configuring a sub route flow includes:
  an item selection module, configured to determine at least one test item of the semiconductor product;
  a template obtaining module, configured to obtain a first test template corresponding to the test item, wherein the first test template includes preset test parameters;
  a display module, configured to display the preset test parameters;
  a parameter adjustment module, configured to receive test parameters adjusted according to the preset test parameters, and configure current test parameters of the test item according to the adjusted test parameters; and
  a sub route flow generation module, configured to form the sub route flow of the semiconductor product according to the current test parameters of the test item.

The third aspect of the present disclosure provides a non-temporary computer-readable storage medium, storing a computer program therein, wherein when the computer program is executed, steps of the method described above are implemented.

The fourth aspect of the present disclosure provides a computer equipment, including a processor, a memory, and a computer program stored in the memory, wherein when the processor executes the computer program, steps of the method described above are implemented.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without any creative efforts.

DETAILED DESCRIPTION

A clear and complete description will be made to the technical solutions in the embodiments of the present disclosure below in combination with the drawings in the embodiments of the present disclosure. Apparently, the embodiments described are part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

The present disclosure provides a method for configuring a sub route flow, the sub route flow being a route flow different from a main route flow in the testing of a semiconductor product, the method including: determining at least one test item of the semiconductor product; obtaining a first test template corresponding to the test item, and displaying preset test parameters included in the first test template; receiving test parameters adjusted according to the preset test parameters, and configuring current test parameters of the test item; and forming a sub route flow of the semiconductor product according to the current test parameters of the test item. With the solution of the present disclosure, the user only needs to input or select a test item to bring out preset test parameters according to a rule, and then edits test parameters according to the requirements, which can reduce the time for the user to manually input data, reduce the risk of errors caused by manual input, reduce manual operation, and improve work efficiency and the success rate of the sub route flow.

At present, when creating a new experimental route flow, the user needs to manually create an experimental route flow based on the product, download a template, input site-related field data, and import the data into the system. As such, a lot of data is required, the operation is complicated, more time is taken, and the work efficiency is reduced. In addition, there is certain logic rule in each field. Manually inputting data may have the risk of input errors and omissions, and the created route flow parameter settings may affect the test results; in addition, if the related information is modified incorrectly, the information may directly fail to use during the test to affect the experimental progress.

As products and experimental route flows increase, the amount of data increases sharply. When the user manually sets a route flow, manual query is required to check whether the route flow has existed. If the serial number is repeated, the import to the system will fail. Therefore, the manual setting increases the complexity of the operation and has low efficiency.

Figure 1:
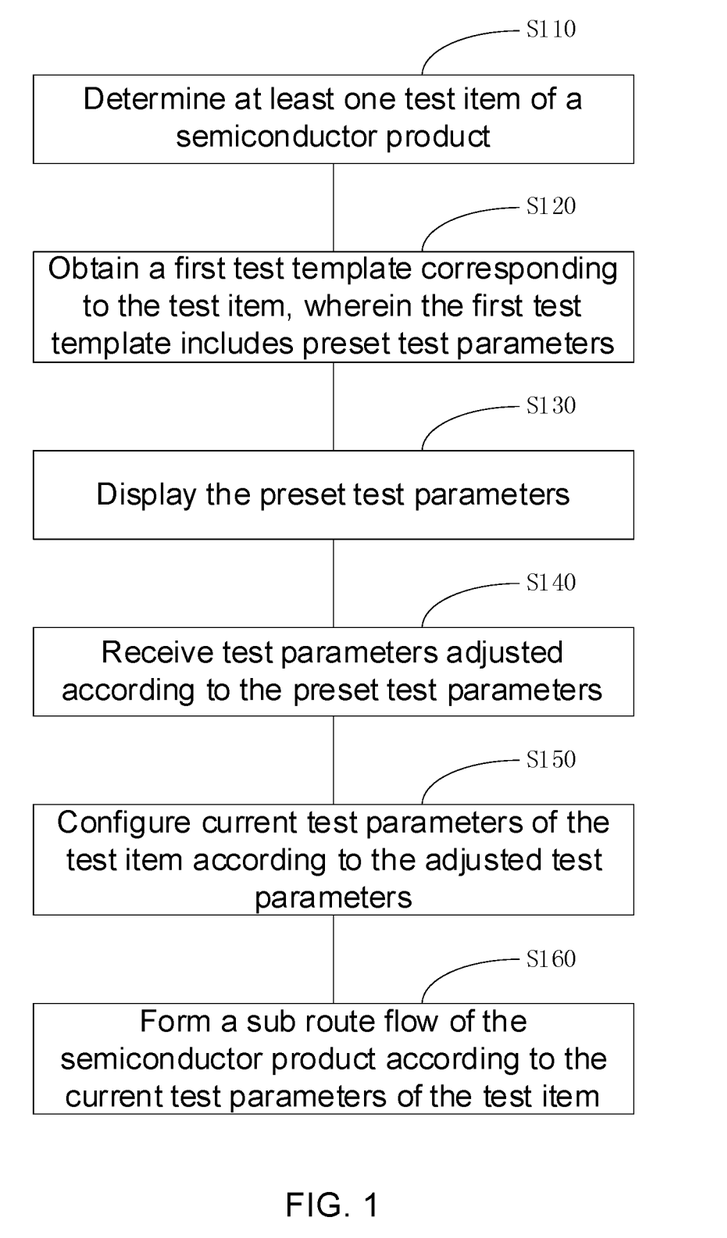
FIG. 1 is a flowchart of a method for configuring a sub route flow according to an exemplary embodiment.

FIG. 1 shows a flowchart of a method for configuring a sub route flow according to an exemplary embodiment of the present disclosure. The following describes the method and apparatus for configuring a sub route flow according to the present disclosure with reference to the accompanying drawings.

The sub route flow corresponds to the configuring method of the present disclosure. It is different from a main route flow in the testing of a semiconductor product, and may be set before or after any preset test item in the main route flow. For example, before a Wafer level burn-in (WLBI) item of the main route flow, a High Temp (HT) test is set to further verify the high temperature resistance range of the product, so as to modify the test template.

In the present disclosure, the main route flow includes one or more preset test items, and each preset test item test corresponding performance of the semiconductor product to meet the requirements of a manufacturing process. The sub route flow in the present disclosure aims at an experimental route flow for any preset test item in the main route flow, for example, it may be an experimental route flow added before or after any preset test item in the main route flow, and it may also be an experimental route flow for optimizing and replacing one or more preset test items in the main route flow, so as to optimize the parameters of the preset test items in the main route flow. In practical applications, a test item may also be called a test site, and each test item or preset test item in the main route flow includes at least one test item or test data.

Referring to FIG. 1, the method for configuring a sub route flow includes the following steps:

Step S110, at least one test item of a semiconductor product is determined.

The test item here may be any test item of performance of the semiconductor product. For example, it may be HT test, Low Temp (LT) test, WLBI test, wear resistance test, etc. Of course, it is not limited thereto. The description here is only a specific embodiment for ease of understanding. It should be understood that any performance test items of semiconductor products should fall within the protection scope of the present disclosure.

Step S120, a first test template corresponding to the test item is obtained, wherein the first test template includes preset test parameters.

For each test item determined in step S110, a corresponding test template is set in the template library. Therefore, according to the determined test item, the corresponding first test template can be directly obtained from the template library. The first test template includes preset test parameters. For example, the preset test parameters may include product information, measurement information, equipment information, formula information, measurement data, etc.

Step S130, the preset test parameters are displayed.

Exemplarily, the preset test parameters included in the first test template corresponding to the determined test item are displayed on a terminal or a user side, so that the user can check whether the preset test parameters are completely identical to parameters to be tested in the current sub route flow; if identical, it indicates that the user can directly call the first test template; if not identical, the user can add, delete or modify the preset test parameters.

Step S140, test parameters adjusted according to the preset test parameters are received.

The adjusted test parameters may be test parameters after the user adds, deletes or modifies the preset test parameters, or the preset test parameters that the user confirms to be completely identical to the parameters to be tested. That is, if the displayed preset test parameters are completely identical to the parameters to be tested in the current route flow after user's observation and comparison in step S130, it can be directly confirmed that the received adjusted test parameters are identical to the confirmed preset test parameters in step S140; if the user discovers that the displayed preset test parameters are incompletely identical to the parameters to be tested in the current route flow, the preset test parameters may be adjusted, for example, added, deleted or modified, then the test parameters after the user adds, deletes or modifies the preset test parameter are received in step S140.

In some optional embodiments, the adjusted test parameters should be within a control threshold of all route flows of the product to be tested, such as the main route flow, to screen unavailable test parameters, thereby avoiding failing to run the sub route flow provided by the embodiments of the present disclosure in the product to be tested. The control threshold may be design data including measurement data, test pollution level, product processing parameters, etc. Of course, it is not limited to this. For example, the control threshold set in all route flows is transferred from a low pollution level to a high pollution level. As such, when the modified adjusted test parameters, for example, the test item formed in the sub route flow changes from a high pollution level to a low pollution level, the control threshold is not satisfied, and the adjusted test parameters are further modified to satisfy the control threshold. The above judgment on the test parameters may be set as predetermined rules, such as control rules. After the user adjusts the test parameters, the system automatically judges the adjusted test parameters according to the predetermined rules. In one embodiment, configuring current test parameters of the test item according to the adjusted test parameters includes the following steps:

determining whether the descriptions of the adjusted test parameters conforms to the predetermined rules; and if conforming, configuring the current test parameters of the test item, and generating a second test template according to the current test parameters of the test item.

When it is determined that the descriptions of the adjusted test parameters do not conform to the predetermined rules, an error prompt box is displayed on a route flow generating device or terminal, to prompt the user that the contents in the adjusted test parameters do not conform to the predetermined rules or that the descriptions of the adjusted test parameters do not conform to the predetermined rules, to modify. After user's modification, whether the descriptions of the modified test parameters conform to the predetermined rules are judged again, the judgment is repeated until the descriptions of the modified test parameters conform to the predetermined rules, then the current test parameters of the test item are configured, and a second test template is generated. This judgment process and the setting of error prompt can reduce user confirmation. In addition, the new route flow is generated according to the corresponding rule, so there is no repeated data, and the repeatability of the test template library is reduced.

Step S150, current test parameters of the test item are configured according to the adjusted test parameters.

In this step, the current test parameters of the test item determined in step S110 are generated according to the test parameters received in step S140. Then, the current test parameters can be saved to generate a new test template corresponding to the test item, which facilitates subsequent call or adjustment.

Step S160, a sub route flow of the semiconductor product is formed according to the current test parameters of the test item.

According to the current test parameters of the test item configured in step S150, and according to a first preset rule, new route flow information is automatically generated, including sub route flow information, measurement information, site entry and exit pollution level, cleaning item information, site sequence, cut-in/cut-out information of each site, formula information, etc., to generate a sub route flow required for this semiconductor product. Then the sub route flow and test parameters are outputted and fed back to the user, for example, the sub route flow and data are fed back to the user in the form of an Excel table, so that the user can export and save or import the same to a test device for direct use.

The first preset rule is a rule preset by the user to generate a sub route flow according to the test parameters. Exemplarily, after the user adjusts the test parameters, the test parameters are arranged and expressed based on the law and form set in the first preset rule according to the requirements of the adjusted test parameters for the test environment, test device parameters, a sequence of test processes, etc., for example, the test parameters are expressed in the form of a table based on the law set in the first preset rule.

In the embodiment of the present disclosure, the test item determined by the sub route flow to be configured is the same with a preset test item in the main route flow, or the test item determined by the sub route flow to be configured is different from the preset test item in the main route flow. Exemplarily, the preset test item in the main route flow is WLBI test, and the test item determined by the sub route flow to be generated may be WLBI test, HT test or LT test. For example, the test item determined by the sub route flow of the present disclosure may be at least one WLBI test before or after the WLBI test of the main route flow, or may be one WLBI test and one HT test performed sequentially after the WLBI test of the main route flow.

It should be pointed out that the sub route flow generated in the present disclosure may be selected from the same test template library as the main route flow, or a separate template library may be set up to be selected by the Sub Route Flow alone.

When the sub route flow to be configured in the present disclosure is executed, the cut-in position and the cut-out position of the sub route flow are configured as the same or different positions in the main route flow.

In some embodiments, the cut-in position of the sub route flow may be any position after the first preset test item of the main route flow, or may be a position after the start of the main route flow and before the first preset test item; the cut-out position may be any position before the last preset test item in the main route flow, or before the end of the main route flow and after the last preset test item. The embodiments of the present disclosure test and verify the main route flow through the cut-in position and the cut-out position of the sub route flow, and can thus optimize the main route flow. In some embodiments, the cut-in position and the cut-out position of the sub route flow are configured in one of the following ways:

The cut-in position of the sub route flow is before the nth preset test item in the main route flow, and the cut-out position is before or after the (n+m)th preset test item in the main route flow;

Alternatively,

The cut-in position of the sub route flow is after the nth preset test item in the main route flow, and the cut-out position is after the (n+m)th preset test item in the main route flow;

Wherein, n is an integer greater than or equal to 1, and m is an integer greater than or equal to 0.

For example, the cut-in position of the sub route flow is configured before the first preset test item of the main route flow, and the cut-out position may be configured before or after the first preset test item, or configured before or after a certain preset test item after the preset test item. For another example, the cut-in position of the sub route flow is configured as a preset test item in the middle of the main route flow, and the cut-out position may be configured before or after the preset test item, or configured before or after the last preset test item of the main route flow. For another example, the cut-in position of the sub route flow is configured after the first or certain preset test item of the main route flow, and the cut-out position may be configured after the preset test item, or configured before or after a preset test item after this preset test item, for example, before or after the last preset test item.

Figure 2:
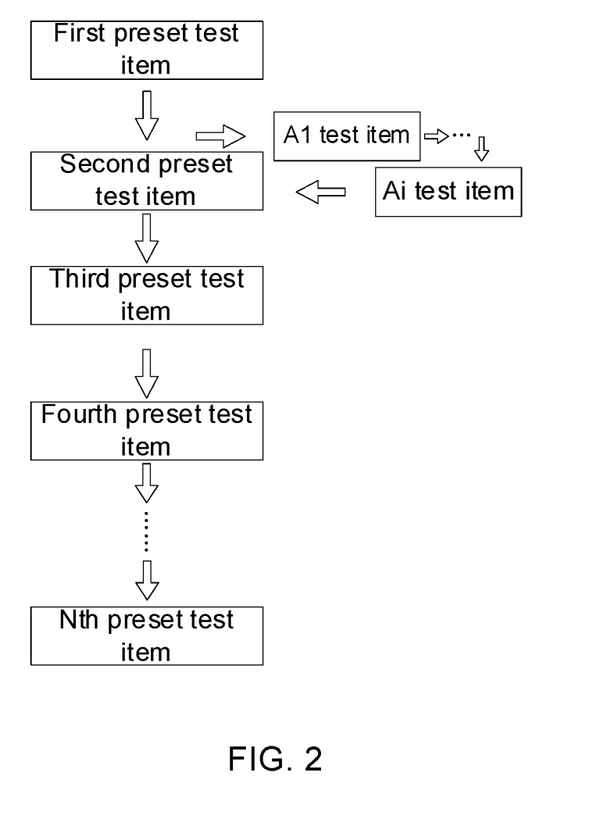
FIG. 2 are schematic diagrams of a route flow according to an exemplary embodiment.
Figure 3:
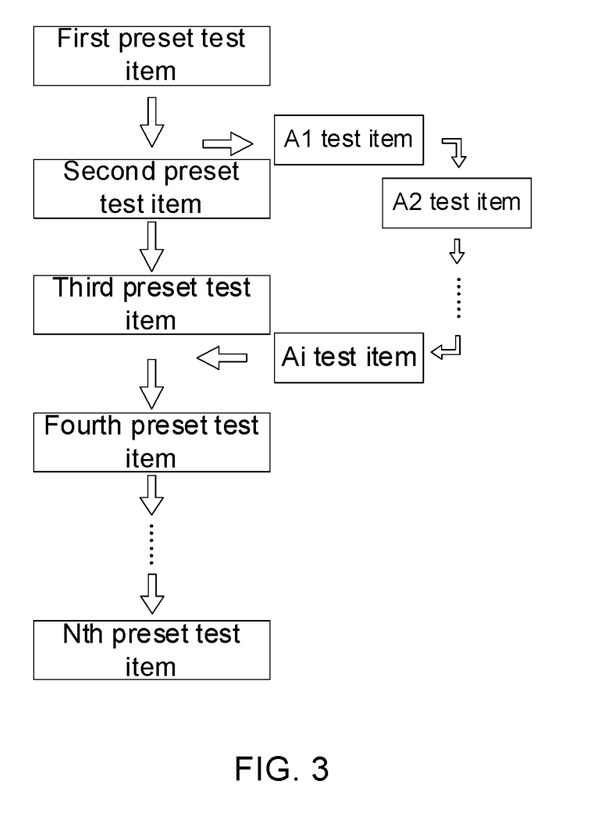
FIG. 3 are schematic diagrams of a route flow according to an exemplary embodiment.
Figure 4:
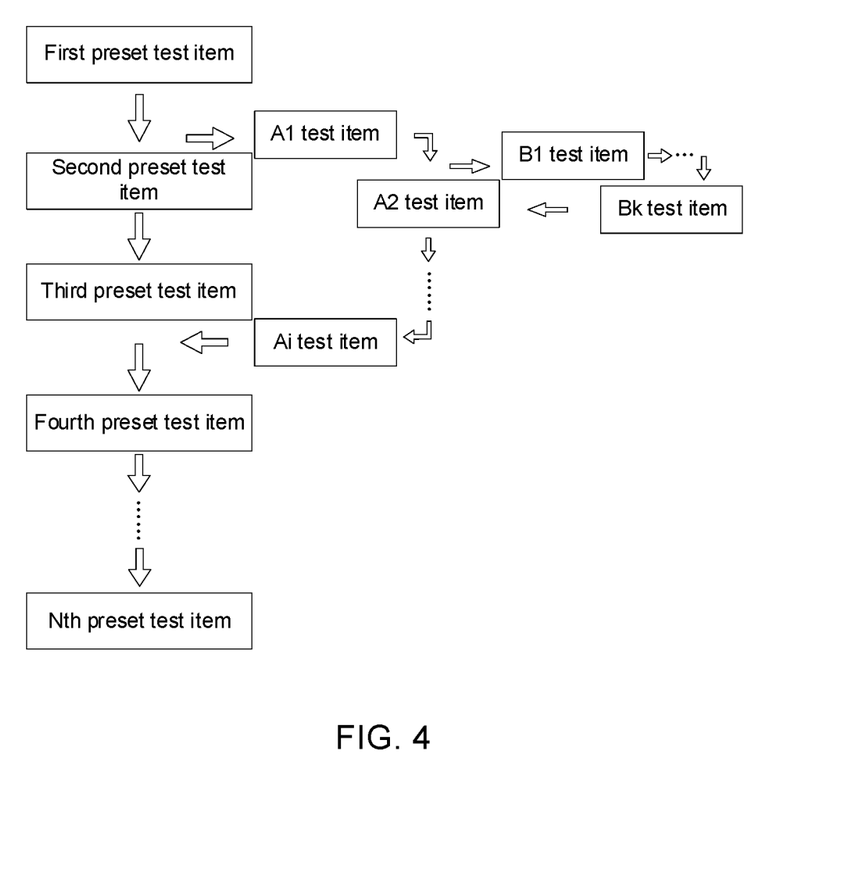
FIG. 4 are schematic diagrams of a route flow according to an exemplary embodiment.

FIGS. 2-4 respectively show schematic diagrams of a sub route flow configured in an exemplary embodiment. The main route flow includes N preset test items set in sequence, wherein N is an integer greater than 1: the first preset test item, the second preset test item, the third preset test item, the fourth preset test item . . . the Nth preset test item. The sub route flow configured in the present disclosure includes $A_1$ test item . . . $A_i$ test item, wherein i is an integer greater than or equal to 1.

In the embodiment shown in FIG. 2, the cut-in position and the cut-out position of the sub route flow configured in this solution are, for example, both configured after the first preset test item and before the second preset test item, that is, after the first preset test item is executed, the $A_1$ test item . . . $A_i$ test item are executed in sequence, and then the second preset test item . . . the Nth preset test item are executed in sequence. In this embodiment, the configured sub route flow may be regarded as a supplementary optimization route flow to the main route flow.

In the embodiment shown in FIG. 3, the cut-in position of the sub route flow configured in this solution is a position after the first preset test item and before the second preset test item in the main route flow, and the cut-out position is a position after the third preset test item and before the fourth preset test item in the main route flow. The execution sequence is: first preset test item→$A_1$ test item→$A_2$ test item→ . . . →$A_i$ test item→fourth preset test item→ . . . →Nth preset test item. In this embodiment, if the configured sub route flow is more conducive to obtaining accurate test results, the second preset test item and the third preset test item in the main route flow can be optimized and replaced. Of course, if it is not more conducive to obtaining accurate test results, the preset test items in the main route flow may not be replaced.

It should be pointed out that the sub route flow of the present disclosure may supplement or replace and optimize one or several preset test items in the main route flow as shown in FIG. 2 or FIG. 3, and the test items in the sub route flow configured may also be supplemented or replaced by using the solution of the present disclosure. In the embodiment shown in FIG. 4, a sub route flow is configured to supplement and optimize the sub route flow configured in the embodiment shown in FIG. 3. The cut-in position and the cut-out position are between the $A_1$ test item and the $A_2$ test item, and the supplementary route flow includes a $B_1$ test item . . . a $B_k$ test item set in sequence, wherein k is an integer greater than or equal to 1. The execution sequence of the final route flow of this embodiment is: first preset test item→$A_1$ test item→$B_1$ test item→ . . . →$B_k$ test item→$A_2$ test item→ . . . →$A_i$ test item→fourth preset test item→ . . . →Nth preset test item.

Figure 5:
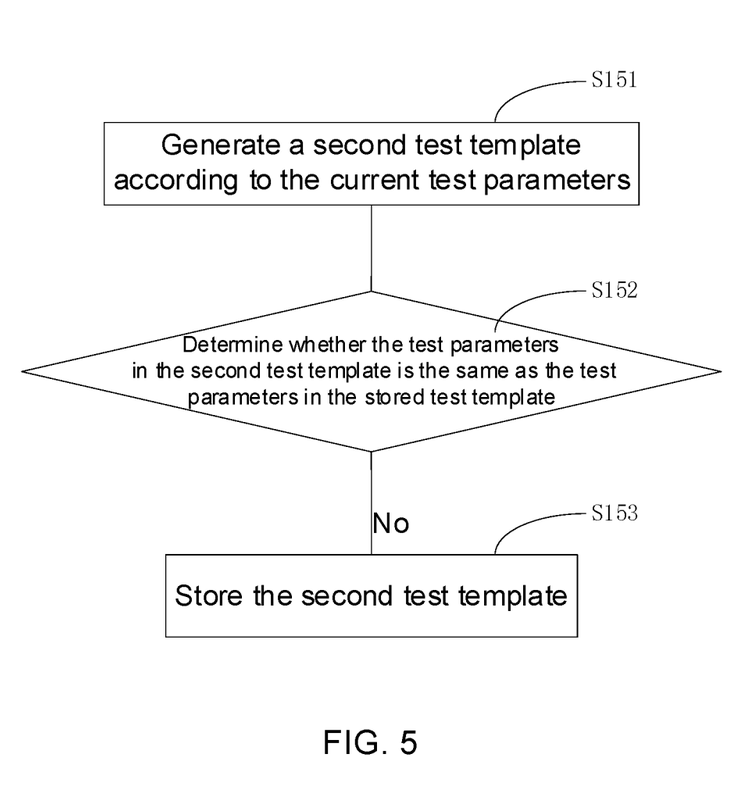
FIG. 5 is a supplementary flowchart of the method for configuring a sub route flow according to an exemplary embodiment.

FIG. 5 is a supplementary flowchart of the method for configuring a sub route flow according to another embodiment of the present disclosure. In this embodiment, the method for configuring the sub route flow further includes:

Step S151, generating a second test template according to the current test parameters of the test item;

Step S152, determining whether the test parameters in the second test template are the same as the test parameters in the stored test template;

Step S153, if not, storing the second test template. The same in step S152 indicates that the test parameters in the second test template have the same names, parameter values or parameter thresholds, the same number of parameters, etc. as the test parameters in the stored template. In this embodiment, it is determined whether the test parameters in the second test template are completely identical to the test parameters in the stored test template; if they are completely identical, it indicates that the generated second test template has existed in the template library; if they are incompletely identical, it indicates that the generated second test template does not exist in the template library, then it can be stored and become a new test template for subsequent direct call.

Figure 6:
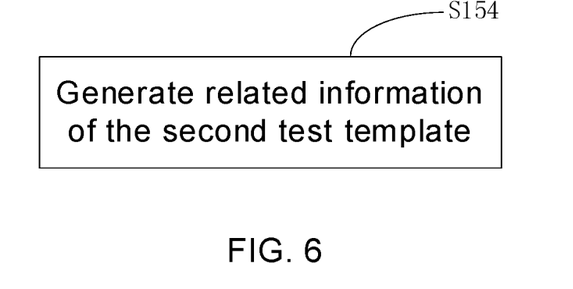
FIG. 6 is a supplementary flowchart of the method for configuring a sub route flow according to an exemplary embodiment.

FIG. 6 is a supplementary flowchart of another embodiment of the present disclosure. Referring to FIG. 6, the method for configuring a sub route flow of the present disclosure further includes:

Step S154, generating related information of the second test template.

In this embodiment, step S154 may be executed after the second test template is generated, or executed after the second test template is stored. For example, after the second test template is generated, related information of the second test template is generated according to a second preset rule, and then after it is determined that the test parameters in the second test template are different from the test parameters in the stored test template, the second test template and the related information of the second test template are stored at the same time. For another example, after the second test template is stored, related information of the second test template is generated and then stored; after it is determined that the test parameters in the second test template are different from the test parameters in the stored test template, related information of the second test template is generated according to a second preset rule, and then the second test template and the related information of the second test template are stored at the same time.

The second preset rule refers to a rule for generating the related information of the second test template. Exemplarily, in order to ensure that the related information displayed when test templates are called from the test template library is identical to facilitate user's judgment and selection, when the test templates are saved, the types of related information of the generated test templates need to be identical. Therefore, the second preset rule may be set to automatically generate related information of a test template generated each time according to the second preset rule. After the second test template is generated, the related information of the second test template can be automatically generated according to the second preset rule, so as to facilitate the subsequent recall of the second test template after being saved.

In the solution of the present disclosure, the related information of the second test template generated according to the second preset rule includes one or more of the following: information related to identification of the sub route flow, information related to measurement of the sub route flow, information related to the test item in the sub route flow, information related to user selection in the sub route flow, information related to the main route flow, etc.

The information related to identification of the sub route flow includes information such as a name and an identifier of the sub route flow; the information related to test items includes a test sequence of test items in the sub route flow, cut-in/cut-out operation information of the test items, pollution levels and cleaning information of the test items, etc.; the information related to the main route flow includes a test sequence between the test items of the main route flow, cut-in/cut-out operation information, etc.

Figure 7:
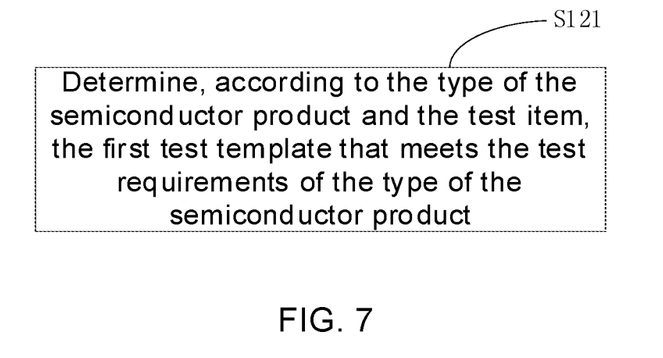
FIG. 7 is a supplementary flowchart of the method for configuring a sub route flow according to an exemplary embodiment.

FIG. 7 shows a supplementary flowchart of an exemplary embodiment of the present disclosure. In this embodiment, the method for configuring a sub route flow further includes:

Step S121, according to the type of the semiconductor product and the test item, the first test template that meets the test requirements of the type of the semiconductor product is determined.

This step is mainly used to determine the first test template that matches the type of the semiconductor product and the test item in the stored test template library. After the user inputs the type of the semiconductor product and the test item, if there are a plurality of test templates that meet the requirements, the test templates that meet the requirements are displayed on a configuration device or terminal of the sub route flow for the user to choose. In some embodiments, while the test templates that meet the requirements are displayed, details of the test templates that meet the requirements, such as test parameters, equipment information, and pollution levels, may also be displayed, and information about the differences between the test templates may also be displayed, so that the user can make judgments and choices according to the actual requirements.

In some embodiments of the present disclosure, when the determined test items required for the semiconductor product are plural:

Displaying the preset test parameters includes: sequentially displaying the preset test parameters corresponding to each test item in the order of the test items in the sub route flow of the semiconductor product;

Configuring the current test parameters of the test item includes: sequentially configuring the current test parameters corresponding to each test item according to the adjusted test parameters of each test item.

Figure 8:
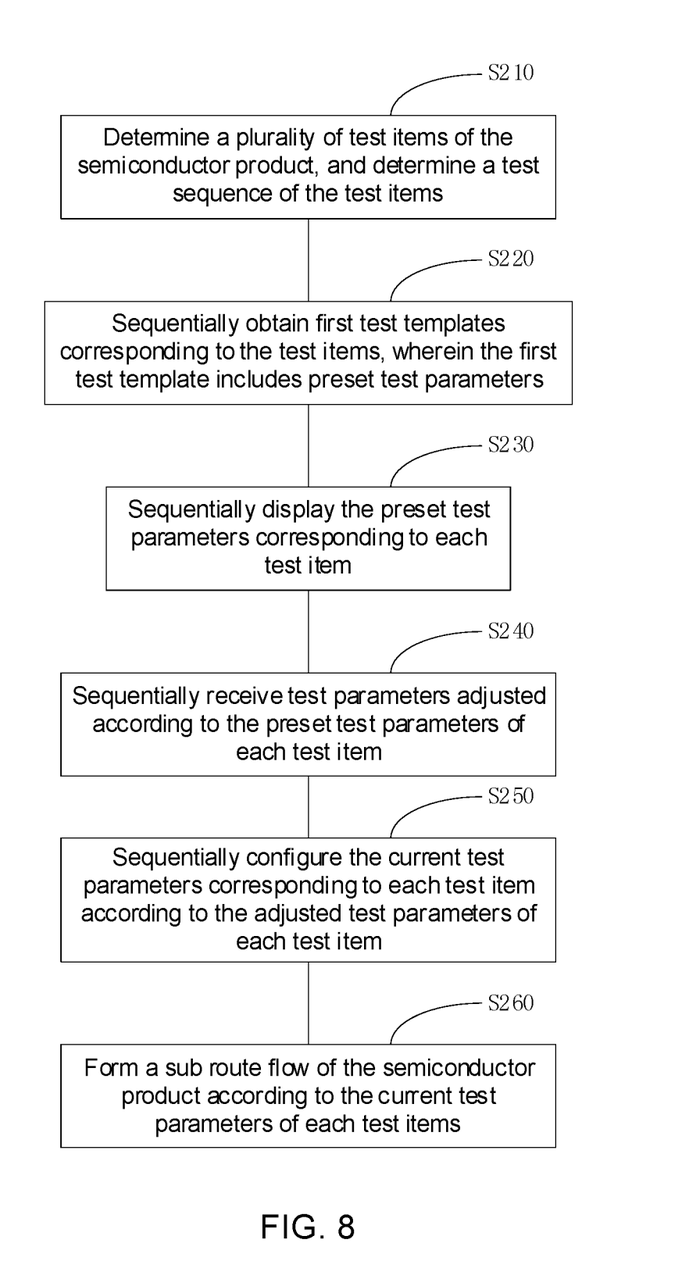
FIG. 8 is a flowchart of a method for configuring a sub route flow according to an exemplary embodiment.

FIG. 8 shows a flowchart of the method for configuring a sub route flow when there are a plurality of test items. Referring to FIG. 8, the method for configuring a sub route flow in this embodiment includes the following steps:

Step S210, determining a plurality of test items of the semiconductor product, and determining a test sequence of the test items;

Step S220, sequentially obtaining a first test template corresponding to each test item according to the sequence of the test items in a route flow of the semiconductor product, wherein the first test template includes preset test parameters;

Step S230, sequentially displaying the preset test parameters corresponding to each test item according to the sequence of the test items in the sub route flow of the semiconductor product;

Step S240, sequentially receiving test parameters adjusted according to the preset test parameters of each test item;

Step S250, sequentially configuring current test parameters corresponding to each test item according to the adjusted test parameters of each test item;

Step S260, forming a sub route flow of the semiconductor product according to the current test parameters of each test items.

In this embodiment, the test items of the semiconductor product are the same or different. For example, after the WLBI test item of the main route flow, three HT tests may be performed sequentially, or one HT test and one LT test may be performed in sequence, or two HT tests and one pre-LT test may be performed in sequence.

Figure 9:
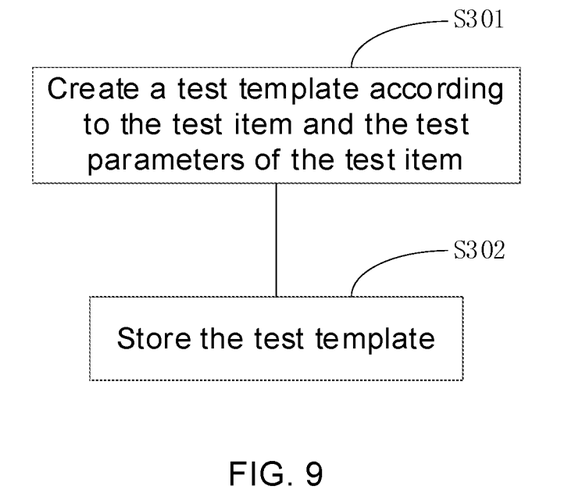
FIG. 9 is a supplementary flowchart of the method for configuring a sub route flow according to an exemplary embodiment.

FIG. 9 is a supplementary flowchart of an exemplary embodiment of the present disclosure. The method for configuring a sub route flow in this embodiment further includes:

Step S301, creating a test template according to the test item and the test parameters of the test item;

Step S302, storing the test template.

Steps S301 and S302 are a process of creating a test template according to the test item and the corresponding test parameters to form a test template library. The first test template obtained after the user determines a test item may be selected and obtained from the test template library. Alternatively, when the user does not call any test template in the stored test template library, or when there is no test template required by the user in the stored test template library, the user needs to create a new test template to refresh or supplement the test template library.

In some embodiments, initially formed test templates and second test templates formed in the historical test process together constitute the test template library. For example, historical test parameters formed in actual operations and applications, as well as second test templates formed during the generation of sub route flows, can be stored in the test template library for subsequent selection, application or adjustment, and can also be shared to other users.

It should be pointed out that, in the solution of the present disclosure, the test parameters of the test item include a test environment related test parameter, a semiconductor product related test parameter, and/or a semiconductor product test device related parameter, etc.

With the technical solution of the present disclosure, rules fed back by the user may be collected first, then site information (or test items) of each semiconductor product may be written into a database, and according to the site information (or test items) inputted by the user, contents (including site information, equipment information, preset test parameters, formula information, etc.) of other related fields may displayed at the same time. In actual applications, there are related corresponding relationships between wafers and products (or test items), between products and sites, and between sites and parameters. Under normal circumstances, wafers and products uniquely correspond; site information and parameter information for each product exist in the database, but some experiments require special sites/parameters for distinguishing. For this requirement, the system administrator can pre-configure them, and then the user can select the required new sites/parameters.

In the embodiments of the present disclosure, the user can provide set data for the system, and the system will default to directly call the contents of some fields in the related test template according to the information such as product type selected by the user, without user's manual input, which greatly reduces user's operation time, avoids wrong input caused by user's wrong operation, and improves work efficiency; the user only needs to confirm whether the test requirement of the product conforms to the preset test parameters of the test template, and modifies and confirms the non-conforming part, the system automatically verifies the user's adjustment, and when the test parameters adjusted by the user does not conform to the predetermined rules, the system directly prompts of the part that does not conform to the predetermined rules, which facilitates targeted modification of the user, avoids discrepancy between the created sub route flow and the product test requirement, and further improves the work efficiency. In addition, the system can also help the user compare the original test templates in the test template library to ensure that the newly generated test template is a brand-new test template, so as to avoid failures caused by repeated input to the system, and ensure the correctness of test templates, and avoid the repeatability of the test template library.

Figure 10:
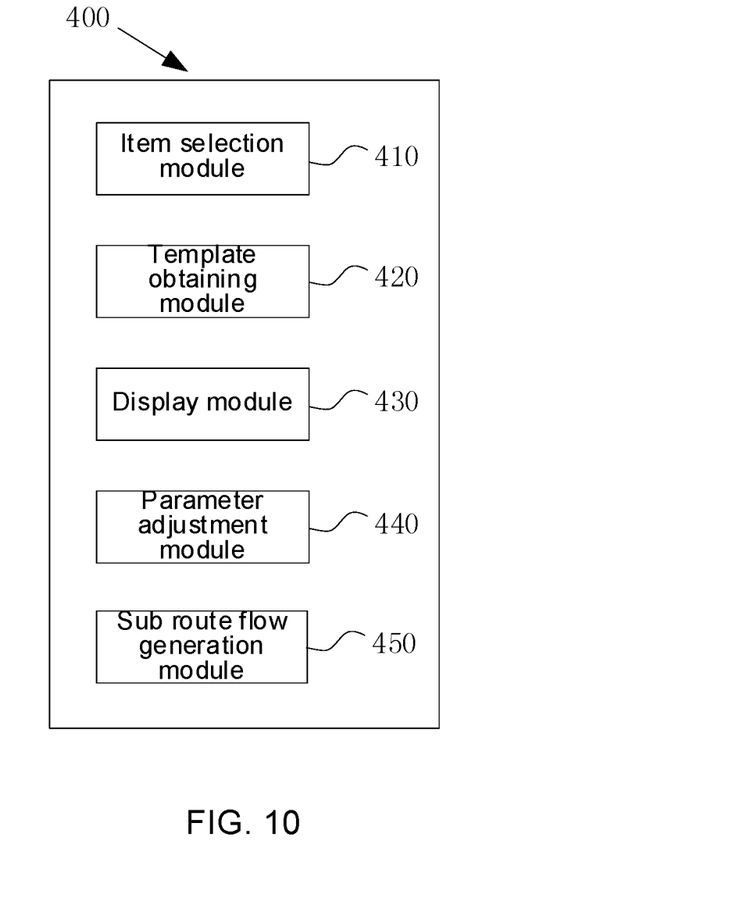
FIG. 10 is a block diagram of an apparatus for configuring a sub route flow according to an exemplary embodiment.

According to the second aspect of the present disclosure, the present disclosure further provides an apparatus for configuring a sub route flow, the sub route flow being a route flow different from a main route flow in the testing of a semiconductor product. FIG. 10 shows a block diagram of an embodiment of an apparatus for configuring a sub route flow. Referring to FIG. 10, the apparatus 400 for configuring a sub route flow according to the present disclosure includes: an item selection module 410, a template obtaining module 420, a display module 430, a parameter adjustment module 440, and a sub route flow generation module 450.

The item selection module 410 is configured to determine at least one test item of the semiconductor product. The test item selected by the item selection module 410 may be the same as or different from a preset test item of the main route flow. For example, when the preset test item of the current main route flow is high temperature test, the test item of the current sub route flow determined by the item selection module 410 may be high temperature test, burn-in test or low temperature test. When the item selection module 410 determines a plurality of test items of the semiconductor product, the test items may be the same or different. As such, the item selection module 410 is further configured to determine a test sequence of the test items.

The template obtaining module 420 is configured to obtain a first test template corresponding to the test item, wherein the first test template includes preset test parameters. The first test template is selected by the template obtaining module 420 from a stored test template library according to the information such as the type of the semiconductor product tested this time and the determined test item.

The display module 430 is configured to display the preset test parameters, so that the user can view and verify whether the preset test parameters in the first test template meet the test requirements of the current sub route flow.

The parameter adjustment module 440 is configured to receive test parameters adjusted according to the preset test parameters, and configure current test parameters of the test item according to the adjusted test parameters. When the user confirms that the preset test parameters in the first test template are different from the test requirement of the current sub route flow, the parameter adjustment module 440 may adjust the preset test parameters, for example, add, delete, or modify the value of the parameters, and the parameter adjustment module 440 may configure the current test parameters of the test item of the sub route flow according to the user's adjustment result.

The sub route flow generation module 450 is configured to form a sub route flow of the semiconductor product according to the current test parameters of the test item.

In an optional embodiment, the parameter adjustment module 440 is further configured to determine, after receiving the test parameters adjusted by the user, whether the descriptions of the adjusted test parameters conform to predetermined rules, such as control rules: if conforming, generate the current test parameters of the corresponding test item, and generate a second test template according to the current test parameters of the corresponding test item; if not conforming, prompt the user that the description of the adjusted test parameters do not conform to the predetermined rules, for the user to adjust or modify, until the descriptions of the test parameters re-adjusted by the user conform to the predetermined rules.

Figure 11:
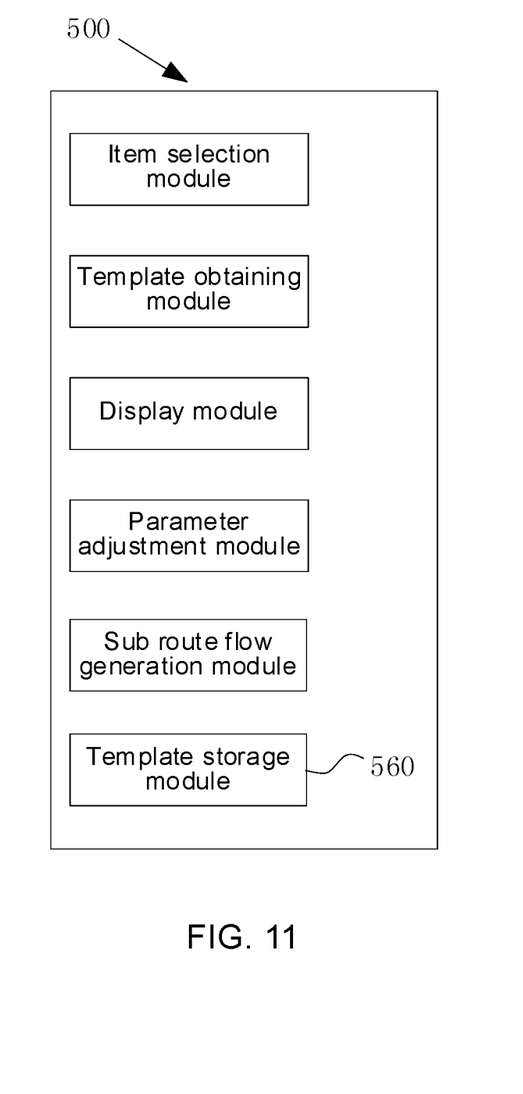
FIG. 11 is a block diagram of an apparatus for configuring a sub route flow according to another exemplary embodiment.

FIG. 11 shows a block diagram of a second exemplary embodiment of an apparatus for generating a sub route flow of the present disclosure. In this embodiment, the apparatus 500 for generating a sub route flow further includes a template storage module 560, configured to store the second test template when it is determined that the test parameters in the second test template are different from the test parameters in the stored test template. The second test template stored by the template storage module 560 may be stored in the stored test template library for updating the test template library, so that the user can directly call and refer to the same later.

In an optional embodiment, the template storage module 560 is further configured to generate related information of the second test template, and store the generated related information of the second test template.

In another exemplary embodiment, the template storage module 560 is further configured to create new test templates according to the test items inputted by the user and the test parameters related to the test items, and store the created test templates to generate the test template library.

Figure 12:
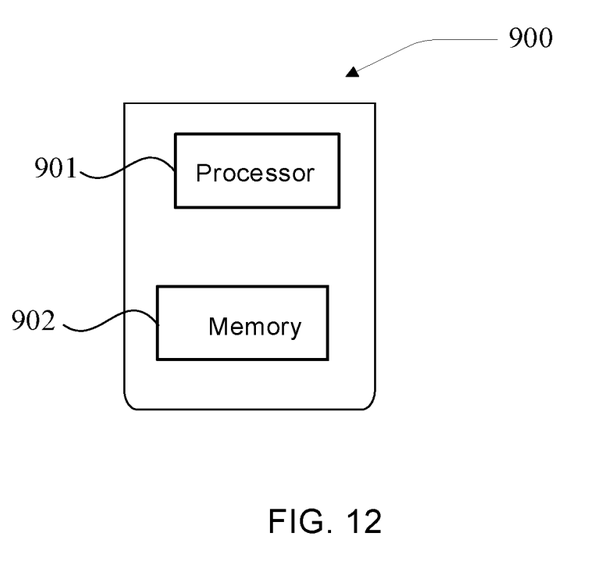
FIG. 12 is a block diagram of a computer equipment according to an exemplary embodiment. (General structure of a terminal)

FIG. 12 is a block diagram of a computer equipment 900 for implementing the method for configuring a sub route flow according to an exemplary embodiment. For example, the computer equipment 900 may be provided as a terminal equipment. Referring to FIG. 12, the computer equipment 900 includes a processor 901, and the number of processors may be one or more as required. The computer equipment 900 further includes a memory 902 for storing instructions executable by the processor 901, such as application programs. The number of memories may be one or more as required. The stored application programs may be one or more. The processor 901 is configured to execute the instructions to implement the above-mentioned method.

Those skilled in the art should understand that the embodiments of the present disclosure may be provided as a method, an apparatus (equipment), or a computer program product. Therefore, the present disclosure may be in the form of a full hardware embodiment, a full software embodiment, or an embodiment combining software and hardware. In addition, the present disclosure may be in the form of a computer program product implemented on one or more computer available storage media including computer available program codes. The computer storage media include volatile and nonvolatile, removable and non-removable media implemented in any method or technology for storing information (such as computer readable instructions, data structures, program modules, or other data), including but not limited to RAM, ROM, EEPROM, flash memory or other memory technology, CD-ROM, digital versatile disk (DVD) or other optical disk storage, magnetic cassette, magnetic tape, magnetic disk storage or other magnetic storage apparatus, or any other media that can be used to store desired information and can be accessed by a computer. Moreover, it is well known to those of ordinary skill in the art that the communication media generally include computer readable instructions, data structures, program modules, or other data in modulated data signals such as carriers or other transmission mechanism, and may include any information transmission media.

In an exemplary embodiment, a non-temporary computer-readable storage medium including instructions is provided, for example, the memory 902 including instructions. The instructions may be executed by the processor 901 of the computer equipment 900 to complete the above-mentioned method, and the instructions may be computer programs. For example, the non-temporary computer readable storage medium may be an ROM, a random access memory (RAM), a CD-ROM, a magnetic tape, a floppy disk, an optical data storage device, etc.

A non-temporary computer readable storage medium, when the computer program in the storage medium is executed by the processor of the memory testing equipment, enables the memory testing equipment to execute the following steps:

Step S110, determining at least one test item of the semiconductor product;

Step S120, obtaining a first test template corresponding to the test item, wherein the first test template includes preset test parameters;

Step S130, displaying the preset test parameters;

Step S140, receiving test parameters adjusted according to the preset test parameters;

Step S150, configuring current test parameters of the test item according to the adjusted test parameters;

Step S160, forming a sub route flow of the semiconductor product according to the current test parameters of the test item.

The present disclosure is described with reference to the flowcharts and/or block diagrams of the methods, apparatuses (equipment) and computer program products according to embodiments of the present disclosure. It should be understood that computer program instructions can implement each process and/or block in the flowcharts and/or block diagrams and a combination of processes and/or blocks in the flowcharts and/or block diagrams. These computer program instructions may be provided to a general-purpose computer, a dedicated computer, an embedded processor, or a processor of other programmable data processing device to generate a machine, so that an apparatus configured to implement functions specified in one or more processes in the flow diagrams and/or one or more blocks in the block diagrams is generated by using instructions executed by the general-purpose computer or the processor of other programmable data processing device.

These computer program instructions may also be stored in a computer readable memory that can guide a computer or another programmable data processing device to work in a specific manner, so that the instructions stored in the computer readable memory generate a product including an instruction apparatus, wherein the instruction apparatus implements functions specified in one or more processes in the flowcharts and/or one or more blocks in the block diagrams.

These computer program instructions may also be loaded into a computer or another programmable data processing device, so that a series of operation steps are performed on the computer or another programmable data processing device to generate processing implemented by a computer, and instructions executed on the computer or another programmable data processing device provide steps for implementing functions specified in one or more processes in the flowcharts and/or one or more blocks in the block diagrams.

In the present disclosure, the terms "include", "comprise", and any variants thereof are intended to cover a non-exclusive inclusion, so that an article or device that includes a series of elements not only includes those elements, but also includes other elements not listed explicitly, or includes inherent elements of the article or device. In the absence of more limitations, an element defined by the statement "include a . . . " does not exclude other same elements existing in the article or device including the element.

Although the preferred embodiments of the present disclosure are described, those skilled in the art can make further variations and modifications to these embodiments once they are aware of the basic inventive concept. Therefore, the appended claims are intended to be interpreted as including the preferred embodiments and all the variations and modifications falling into the scope of the present disclosure.

Apparently, those skilled in the art can make various modifications and variations to the present disclosure without departing from the spirit and scope of the present disclosure. Thus, if these modifications and variations of the present disclosure fall into the scope of the claims of the present disclosure and equivalent technologies thereof, the present disclosure is intended to include these modifications and variations.

In the method and apparatus for configuring a sub route flow provided by the embodiments of the present disclosure, related preset test parameters can be automatically called according to the test item inputted by the user, which can reduce the time for the user to manually input data, reduce the risk of errors caused by manual input, reduce user operations, reduce the frequency of wrong input, and improve the work efficiency and the success rate of the sub route flow; and the preset test parameters can also be adjusted according to user needs, with strong flexibility and high efficiency.

The technical solutions provided by the embodiments of the present disclosure can automatically call related preset test parameters according to the test item inputted by the user to reduce user operations and reduce the frequency of wrong input, and can adjust the test parameters according to user needs, with strong flexibility and high efficiency.

What is claimed is:

1. A method for configuring a sub route flow, the sub route flow being a route flow different from a main route flow in testing of a semiconductor product, comprising:

determining at least one test item of the semiconductor product;

obtaining a first test template corresponding to the test item, wherein the first test template includes preset test parameters;

displaying the preset test parameters;

receiving test parameters adjusted according to the preset test parameters;

configuring current test parameters of the test item according to the adjusted test parameters; and forming the sub route flow of the semiconductor product according to the current test parameters of the test item.

2. The method for configuring a sub route flow according to claim 1, wherein the test item determined by the sub route flow is the same with a preset test item in the main route flow, or the test item determined by the sub route flow is different from the preset test item in the main route flow.

3. The method for configuring a sub route flow according to claim 1, wherein a cut-in position and a cut-out position of the sub route flow are configured as same or different positions in the main route flow.

4. The method for configuring a sub route flow according to claim 1, wherein a cut-in position and a cut-out position of the sub route flow are configured in one of following ways:

the cut-in position of the sub route flow is before an nth preset test item in the main route flow, and the cut-out position is before or after an (n+m)th preset test item in the main route flow;

alternatively, the cut-in position of the sub route flow is after the nth preset test item in the main route flow, and the cut-out position is after the (n+m)th preset test item in the main route flow;

wherein, the n is an integer greater than or equal to 1, and the m is an integer greater than or equal to 0.

5. The method for configuring a sub route flow according to claim 1, further comprising:

generating a second test template according to the current test parameters of the test item;

determining whether test parameters in the second test template are the same as test parameters in a stored test template; and if not, storing the second test template.

6. The method for generating a sub route flow according to claim 5, further comprising:

generating related information of the second test template.

7. The method for configuring a sub route flow according to claim 6, wherein the generating related information of the second test template comprises one or more of the following:

information related to identification of the sub route flow;
information related to measurement of the sub route flow;
information related to the test item in the sub route flow;
information related to user selection in the sub route flow; and
information related to the main route flow.

8. The method for configuring a sub route flow according to claim 1, further comprising:

determining, according to a type of the semiconductor product and the test item, the first test template meeting test requirements of the type of the semiconductor product.

9. The method for configuring a sub route flow according to claim 1, wherein when there are a plurality of the test items, the displaying the preset test parameters comprises:

sequentially displaying the preset test parameters corresponding to each of the test items according to a sequence of the test items in the sub route flow of the semiconductor product;

the configuring current test parameters of the test item according to the adjusted test parameters comprises:

sequentially configuring the current test parameters corresponding to each of the test items according to the adjusted test parameters of each of the test items.

10. The method for configuring a sub route flow according to claim 9, wherein the plurality of the test items are the same or different.

11. The method for configuring a sub route flow according to claim 1, further comprising:

creating a test template according to the test item and the test parameters of the test item; and storing the test template.

12. The method for configuring a sub route flow according to claim 1, wherein the test parameters comprise a test environment related test parameter, a semiconductor product related test parameter, and/or a semiconductor product test device related parameter.

13. A non-temporary computer readable storage medium, storing a computer program therein, wherein when the computer program is executed, steps of the method according to claim 1 are implemented.

14. A computer equipment, comprising a processor, a memory, and a computer program stored in the memory, wherein when the processor executes the computer program, steps of the method according to claim 1 are implemented.

* * * * *